United States Patent [19]

Yamauchi et al.

[11] Patent Number: 4,770,946
[45] Date of Patent: Sep. 13, 1988

[54] SURFACE-TREATED MAGNESIUM OR MAGNESIUM ALLOY, AND SURFACE TREATMENT PROCESS THEREFOR

[75] Inventors: Goro Yamauchi, Higashimurayama; Kishio Arita, Kunitachi; Junichi Seki, Mitaka; Eiichi Sakita, Kodaira; Masato Mino, Tokorozawa; Yuzo Matsudaira, Higashiyamato; Ryozi Takekoshi, Tokorozawa; Yoshimori Miyata, Nerima; Junichi Masuda, Iruma; Yoshitaka Koide, Himeji, all of Japan

[73] Assignee: Nippon Telegraph and Telephone Corporation, Tokyo, Japan

[21] Appl. No.: 865,034

[22] PCT Filed: Oct. 14, 1985

[86] PCT No.: PCT/JP85/00571
    § 371 Date: Apr. 30, 1986
    § 102(e) Date: Apr. 30, 1986

[87] PCT Pub. No.: WO86/02388
    PCT Pub. Date: Apr. 24, 1986

[30] Foreign Application Priority Data

Oct. 16, 1984 [JP] Japan ................ 59-215110
Oct. 16, 1984 [JP] Japan ................ 59-215111
Oct. 11, 1985 [JP] Japan ................ 60-224835

[51] Int. Cl.$^4$ ............... C23C 28/00; C23C 14/02
[52] U.S. Cl. .................. 428/626; 204/38.3; 204/38.7; 204/58.4; 204/192.31; 427/405; 427/409; 427/419.5; 428/411.1; 428/414; 428/423.1; 428/425.8; 428/447; 428/469; 428/524

[58] Field of Search .......... 204/29, 38.3, 38.7, 204/58.4, 192.31; 427/123, 124, 125, 126.3, 405, 409, 419.5; 428/469, 626, 651, 652, 660, 666, 672, 673, 680, 414, 411.1, 524, 447, 423.1, 425.8

[56] References Cited

U.S. PATENT DOCUMENTS 2,276,286  3/1942  Buzzard ................. 204/35
3,144,349  8/1964  Swingler et al. .......... 117/6
4,348,463  9/1982  Ohno et al. ............. 428/429
4,643,951  2/1987  Keem et al. ............. 428/469

FOREIGN PATENT DOCUMENTS 536257  3/1977  U.S.S.R. ............... 204/58.4
826038 12/1959  United Kingdom .

OTHER PUBLICATIONS

H. K. DeLong, Practical Finishes for Magnesium, Metal Progress, Jun. 1970, pp. 105–108.
Brian Chapman, Glow Discharge Processes, John Wiley & Sons, N.Y., 1980, pp. 253–255.
Lester F. Spencer, Chemical Coatings for Magnesium Alloys, Metal Finishing, Sep. 1970, pp. 63–66; Oct. 1970, pp. 52–57.
PCT/JP85/00571/International Search Report No. 0198092.

Primary Examiner—John F. Niebling
Assistant Examiner—William Leader
Attorney, Agent, or Firm—Cushman, Darby & Cushman

[57] ABSTRACT

An oxidized film is formed on the surface of Mg or an Mg alloy, and a thermosetting resin film is formed on the oxidized film. A conductive film is further formed on the thermosetting film. The surface film of the Mg or Mg alloy thus surface-treated has a strong adhesion to the Mg or Mg alloy. The surface-treated Mg or Mg alloy has an excellent corrosion resistance, an excellent heat shock resistance, and a high surface conductivity.

5 Claims, 1 Drawing Sheet

SURFACE-TREATED MAGNESIUM OR MAGNESIUM ALLOY, AND SURFACE TREATMENT PROCESS THEREFOR

TECHNICAL FIELD

The present invention relates to a surface-treated magnesium (Mg) or Mg alloy suitable, for example, for aerospace machines and instruments, electric precision machines and instruments, and automobile parts which are to be improved in corrosion resistance, surface conductivity, abrasion resistance, and heat shock resistance, and to a surface treatment process therefor.

BACKGROUND ART

Light alloys including aluminum (Al) are widely used as the metallic materials employed for aerospace machines and instruments, electric precision machines and instruments, and automobile parts from the view points of reduction of weight, reduction of consumed energy, and upgrading of performance. For example, as can be seen in a casing of an artificial satellite transponder housing, surface conductivity is necessary in a housing including electric and electronic parts and/or circuits for securing stable grounding and improving the electromagnetic interference resistance. In the case of an Al alloy heretofore employed in such a housing, formation of a thick corrosion-resistant insulating film is not needed, since the alloy is excellent in corrosion resistance.

Recently, there has developed a tendency to use an Mg alloy having a 30% or more lighter specific weight than that of the Al alloy instead of the Al alloy in the above-mentioned machines and instruments. Mg is the most chemically active among practical metals. Thus, formation of a rustproof film on the surface of Mg or the Mg alloy is necessary in practical utilization thereof. As to the method of preventing the Mg alloy from corrosion, many studies, including one disclosed in Spencer, L. F. "Chemical Coatings for Magnesium Alloys" (Metal Finishing; Sept., 1970, 63-66 and the same journal; Oct., 1970, 52-57), have been made. Nevertheless, the technique of preventing the Mg alloy from corrosion is not established as yet. Even if a rustproof film is formed on the surface of magnesium by a chemical conversion treatment, an anodizing treatment, wet plating, dry plating, coating, or the like as usual, the rustproof film has micro pinholes present therein, and, hence, cannot prevent the diffusion of the magnesium into the surface film to cause deterioration of the corrosion resistance. Furthermore, when a conductive metallic film of gold (Au), silver (Ag), or the like is disposed on the corrosionproof oxidized film to impart a surface conductivity to Mg or an Mg alloy, cells are formed between the Mg or Mg alloy and conductive metallic film under a wet environment to allow corrosion of Mg or the Mg alloy to progress.

As described above, no effective method of preventing Mg or an Mg alloy from corrosion is established as yet, much less Mg or an Mg alloy satisfactory in both corrosion resistance and surface conductivity is materialized. There has been no method of surface treatment of Mg or an Mg alloy satisfactory for meeting the purpose.

DISCLOSURE OF INVENTION

As described above, the conventional method of surface treatment of Mg or an Mg alloy does not provide not only sufficient corrosion resistance and surface conductivity but also sufficient heat shock resistance and abrasion resistance.

The object of the present invention is to obviate the defects of the conventional method of surface treatment of Mg or an Mg alloy, particularly to provide a surface-treated Mg or Mg alloy excellent in not only corrosion resistance and surface conductivity but also heat shock resistance and abrasion resistance, and a surface treatment process therefor.

For attaining the object, the surface-treated Mg or an Mg alloy according to the present invention is characterized by comprising an oxidized film formed on Mg or an Mg alloy, a thermosetting resin film provided on the oxidized film, and a conductive film provided on the thermosetting resin film.

Here, the thermosetting resin film may be a resin layer consisting of a plurality of different thermosetting resin layers. The conductive film may be a film consisting of a plurality of different metallic layers. The thermosetting resin film and the conductive film may consist of a plurality of different thermosetting resin layers and a plurality different metallic layers, respectively.

The process for treating the surface of Mg or an Mg alloy according to the present invention is characterized by comprising the first step of forming an oxidized film on the surface of Mg or an Mg alloy, the second step of forming a thermosetting resin film on the oxidized film formed in the first step, and the third step of forming a conductive film on the thermosetting resin film formed in the second step.

Here, the first step may be practiced according to either an anodizing treatment or a chemical conversion treatment.

Here, the third step may be practiced according to ion plating, sputtering, or vacuum deposition.

Here, the third step may be a step of forming a conductive film according to ion plating after sputter-cleaning the surface of the thermosetting resin film, a step of forming a conductive film according to sputtering after sputter-cleaning the surface of the thermosetting resin film, or a step of forming a conductive film according to vacuum deposition after sputter-cleaning the surface of the thermosetting resin film.

Here, the thermosetting resin film may consist of a plurality of different thermosetting resin layers. The conductive film may consist of a plurality of different metallic layers. The thermosetting resin film and the conductive film may consist of a plurality of different thermosetting resin layers and a plurality of different metallic layers, respectively.

BEST MODE FOR CARRYING OUT THE INVENTION

The present invention will now be explained in detail with reference to Examples and Comparative Examples.

Five kinds of surface-treated Mg or Mg alloy comprising an oxidized film formed on the surface of the Mg or the Mg alloy according to an anodizing treatment, a thermosetting resin film formed thereon, and a conductive film sequentially formed thereon, and two kinds of Mg alloy treated without an oxidized film or a thermosetting resin film for comparison were prepared according to the following procedures.

(EXAMPLE 1)

Figure 1:
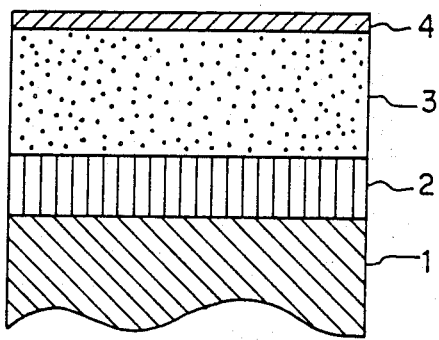
FIGS. 1 and 2 are cross-sections of examples of the surface-treated Mg alloy according to the present invention.

This example will be described with reference to FIG. 1.

A lead wire of an electrode for an anodizing treatment was connected with an alloy plate 1 composed of 3 wt % of Al, 1 wt % of Zn, and the balance of Mg. The alloy plate was then immersed in an aqueous mixture solution of 165 g of KOH, 35 g of KF, 35 g of Na$_3$PO$_4$, 35 g of Al(OH)$_3$, 10 g of KMnO$_4$, and 10 g of MnO$_4$ dissolved in 1l of water, and anodized at a voltage of AC 50 V and at a current density of 2.0 A/dm$^2$ for 15 minutes to form an oxidized film 2 having a thickness of 20 μm on the surface of the alloy plate.

Subsequently, a melamine resin 3 was applied onto the oxidized film 2 at a thickness of 40 μm. The alloy plate was then allowed to stand in air at a humidity of 30% and at a temperature of 35° C. for 72 hours to completely dry the coated melamine resin 3.

Thereafter, sputter-cleaning and simultaneous activation of the surface of the melamine resin were carried out under the conditions of $5\times10^{-5}$ Torr in Ar gas pressure and 20 V in bias voltage. Ion plating on the surface of the melamine resin 3 was then conducted under the conditions of $2\times10^{-4}$ Torr in Ar gas pressure and $-200$ V in bias voltage to form a conductive film 4 having an Au thickness of 5 μm.

In the formation of the conductive film 4, the temperature of the thermosetting resin 3 is required to be kept at or below the thermal decomposition temperature of the resin for avoiding reducing the strength of the thermosetting resin 3 and for enhancing the adhesion between the resin and the conductive film 4.

The alloy plate thus treated was named "Example Sample 1".

(EXAMPLE 2)

An alloy plate composed of 6 wt % of Al, 0.5 wt % of Zn and the balance of Mg was subjected to the same anodizing treatment as in Example 1 to form an oxidized film having a thickness of 20 μm. An epoxy resin was coated on the oxidized film at a thickness of 7 μm and allowed to stand in air at a humidity of 40% and at a temperature of 30° C. for 48 hours to completely solidify the coated epoxy resin.

An Au film having a thickness of 0.5 μm was deposited on the coating film by sputtering under the conditions of $3\times10^{-3}$ Torr in Ar gas pressure and $-300$ V in bias voltage without sputter-cleaning of the surface of the coating film. The alloy plate sample thus treated was named "Example Sample 2".

(EXAMPLE 3)

An alloy plate composed of 9 wt % of Al, 1 wt % of Zn, and the balance of Mg was subjected to the same anodizing treatment as in Example 1 to form an oxidized film having a thickness of 20 μm. A phenolic resin was coated on the oxidized film at a thickness of 10 μm, and allowed to stand in air at a humidity of 60% and at a temperature of 38° C. for 24 hours to completely solidify the coated phenolic resin.

The surface of the coating film was subjected to sputter-cleaning and vacuum deposition to deposit an Au film having a thickness of 10 μm. The alloy plate sample thus treated was named "Example Sample 3".

(EXAMPLE 4)

An alloy plate composed of 3 wt % of Al, 1 wt % of Zn, and the balance of Mg was subjected to the same anodizing treatment as in Example 1 to form an oxidized film having a thickness of 20 μm on the alloy plate.

A melamine resin was coated on the oxidized film at a thickness of 40 μm, and allowed to stand in air at a humidity of 30% and at a temperature of 35° C. for 72 hours to completely dry the coated melamine resin.

Subsequently, the surface of the melamine resin was subjected to sputter-cleaning and vacuum deposition to form an Au film having a thickness of 10 μm on the surface of the resin. The alloy plate sample thus treated was named "Example Sample 4".

(EXAMPLE 5)

The surface of a pure Mg plate was subjected to the same anodizing treatment as in Example 1 to form an oxidized film having a thickness of 20 μm on the surface of the plate.

A melamine resin was coated on the oxidized film at a thickness of 40 μm, and then allowed to stand in air at a humidity of 30% and at a temperature of 35° C. for 72 hours to completely dry the coated melamine resin.

The surface of the dried resin was cleansed and simultaneously activated by sputter-cleaning. An Au film having a thickness of 5 μm was formed on the activated surface by sputtering in the same manner as in Example 2. The Mg plate sample thus surface-treated was named "Example Sample 5".

(COMPARATIVE EXAMPLE 1)

An electrode lead wire was connected with an alloy plate composed of 3 wt % of Al, 1 wt % of Zn, and the balance of Mg. Subsequently, the alloy plate was immersed in an aqueous mixture solution of 165 g of KOH, 35 g of KF, 35 g of Na$_3$PO$_4$, 35 g of Al(OH)$_3$, 10 g of KMnO$_4$, and 10 g of MnO$_4$ dissolved in 1 l of water, and anodized at a voltage of AC 50 V and a current density of 2.0 A/dm$^2$ for 15 minutes to form an oxidized film having a thickness of 20 μm on the surface of the alloy plate.

Subsequently, an Au film having a thickness of 5 μm was formed on the oxidized film by ion plating in the same manner as in Example 1.

The alloy plate sample thus surface-treated was named "Comparative Example Sample 1".

(COMPARATIVE EXAMPLE 2)

A melamine resin was coated on an alloy plate composed of 3 wt % of Al, 1 wt % of Zn, and the balance of Mg at a thickness of 40 μm. Thereafter, the alloy plate was allowed to stand in air at a humidity of 30% and at a temperature of 35° C. for 72 hours to dry the coated melamine resin.

Subsequently, the surface of the dried melamine resin was subjected to sputter-cleaning and subsequent ion plating to form an Au film having a thickness of 5 μm.

The alloy plate sample thus surface-treated was named "Comparative Example Sample 2".

Example Samples 1 to 5 and Comparative Example samples 1 and 2 were examined with respect to corrosion resistance according to a salt spray test, surface conductivity according to a measurement of contact resistance, and heat shock resistance according to a heat shock test. The results are shown in Table 1. The details of each test are as follows.

Salt Spray Test

A 5% NaCl solution is sprayed against an Mg or Mg alloy plate sample heated at 35° C. The corrosion resistance is evaluated in terms of a period of time till appearance of corrosion on the Mg or Mg alloy.

Contact Resistance

An Au probe is pushed against the surface of a surface-treated Mg or Mg alloy plate sample under a load of 10 g. The electric resistance between the probe and the Mg or Mg alloy plate is measured by a milliohm meter to evaluate the surface conductive performance.

Heat Shock Test

An Mg or Mg alloy plate sample was subjected to a heat cycle of alternate repetition of keeping the same at −190° C. for 30 minutes and keeping the same at +100° C. for 30 minutes. Whether the heat shock resistance is good or bad is evaluated in terms of the number of times of repetition till occurrence of degeneration such as peeling and/or cracking of the film.

TABLE 1

| Sample No. | Performance Test | | |
|---|---|---|---|
| | Salt Spary Test | Contact Resistance | Heat Shock Test |
| Example Sample 1 | Corrosion did not occur even after 1,000 hours' spray | 1.2 mΩ | Neither peeling nor cracking occurred even after 10,000 times of the heat cycle. |
| Example Sample 2 | Corrosion did not occur even after 1,000 hours' spray | 1.2 mΩ | Neither peeling nor cracking occurred even after 10,000 times of the heat cycle. |
| Example Sample 3 | Corrosin did not occur even after 1,000 hours' spray | 1.2 mΩ | Neither peeling nor cracking occured even after 10,000 times of the heat cycle. |
| Example Sample 4 | Corrosion did not occur even after 1,000 hours' spray | 1.2 mΩ | Neither peeling nor cracking occurred even after 10,000 times of the heat cycle. |
| Example Sample 5 | Corrosion did not occur even after 1,000 hours' spray | 1.2 mΩ | Neither peeling nor cracking occurred even after 10,000 times of the heat cycle. |
| Comparative Example Sample 1 | Corrosion occurred in 2 hours' spray. | 1.2 mΩ | Degeneration such as peeling and/or cracking occurred in 7 times of the heat cycle. |
| Comparative Example Sample 1 | Corrosion occurred in 3 hours' spray. | 1.2 mΩ | Degeneration such as peeling and/or cracking occurred in 9 times of the heat cycle. |

From the results shown in Table 1 which demonstrates that every one of Example Samples 1 to 5 according to the present invention did not give rise to corrosion of the Mg or Mg alloy even after 1,000 hours in the salt spray test, it will be understood that the surface treatment process of the present invention provides excellent corrosion resistance to Mg or an Mg alloy. On the other hand, it will be understood that formation of either an anodized film or a thermosetting resin film alone on the surface of an Mg or Mg alloy plate sample and subsequent deposition of an Au film thereon provide poor corrosion resistance, as can be seen in the progress of corrosion only after 2 to 3 hours in the salt spray test under the same conditions as in the case of the Example Samples.

The surface-treated Mg or Mg alloy according to the present invention comprises an organic coating film sandwiched between the oxidized film and the Au film. The presence of this coating film serves for buffering a difference in thermal expansion between the oxidized film and the Au film. The Example Samples 1 to 5 of surface-treated Mg or Mg alloy were subjected to the heat shock test in which they were alternately kept at −190° C. for 30 minutes and at +100° C. for 30 minutes. Even after 10,000 times of the cycle were repeated, neither peeling nor cracking of the film occurred, thus demonstrating excellent heat shock resistances thereof. By contrast, in the case of the Comparative Example Samples, degeneration such as peeling and/or cracking of the film appeared after only 7 to 9 times of the heat cycle. Even in the case of the Comparative Example Sample 2 comprising the Au film provided via the melamine resin film on the alloy plate sample without provision of an anodized film on the plate, the heat shock resistance of the sample was low because of poor adhesion of the melamine resin film to the alloy plate sample.

Five kinds of surface-treated Mg or Mg alloy comprising an oxidized film formed on the surface of the Mg or Mg alloy according to a chemical conversion treatment, a thermosetting resin film formed thereon, and a conductive film sequentially formed thereon, and two kinds of Mg alloy treated without an oxidized film or a thermosetting resin film for comparison were prepared according to the following procedures.

(EXAMPLE 6)

An alloy plate composed of 3 wt % of Al, 1 wt % of Zn, and the balance of Mg was immersed in an aqueous mixture solution of 120 g of $Na_2Cr_2O_7$, 1.2 g of $CaF_2$, and 1.2 g of $MgF_2$ dissolved in 1 l of water for 60 minutes to effect a so-called chemical conversion treatment. Thus, an oxidized film having a thickness of 20 Å was formed on the surface of the alloy plate. A melamine resin was coated on the oxidized film at a thickness of 40 μm, and then allowed to stand in air at a humidity of 30% and at a temperature of 35° C. for 72 hours to completely dry the coated melamine.

The coating film was then subjected to sputter-cleaning and subsequent ion plating in the same manner as in Example 1 to form an Au film having a thickness of 5 μm. The alloy plate sample thus surface-treated was named "Example Sample 6".

(EXAMPLE 7)

An oxidized film having a thickness of 20 Å was formed on an alloy plate composed of 6 wt % of Al, 0.5 wt % of Zn, and the balance of Mg according to the same chemical conversion treatment as in Example 6. An epoxy resin was coated on the oxidized film at a thickness of 7 μm, and then allowed to stand in air at a humidity of 40% and at a temperature of 30° C. for 48 hours to completely solidify the coated epoxy resin.

An Au film having a thickness of 0.5 μm was deposited on the coating film by sputtering in the same manner as in Example 2.

The alloy plate sample thus surface-treated was named "Example Sample 7".

(EXAMPLE 8)

An oxidized film having a thickness of 20Å was formed on an alloy plate composed of 9 wt % of Al, 1 wt % of Zn, and the balance of Mg according to the same chemical conversion treatment as in Example 6. A phenolic resin was coated on the oxidized film at a thickness of 10 μm, and then allowed to stand in air at a humidity of 60% and at a temperature of 38° C. for 24 hours to completely solidify the coated phenolic resin. The surface of the coating film was then subjected to sputter-cleaning and subsequent vacuum deposition to form an Au film having a thickness of 10 μm. The alloy plate sample thus surface-treated was named "Example Sample 8".

(EXAMPLE 9)

An alloy plate composed of 3 wt % of Al, 1 wt % of Zn, and the balance of Mg was immersed in a mixture solution of $Na_2Cr_2O_7$, $CaF_2$, and $MgF_2$ for 60 minutes to form an oxidized film having a thickness of 20 Å on the surface of the alloy plate.

A melamine resin was coated on the oxidized film at a thickness of 15 μm, and then allowed to stand in air at a humidity of 30% and at a temperature of 35° C. for 72 hours to completely dry the coated melamine resin.

The surface of the resin was then subjected to sputter-cleaning and subsequent sputtering in the same manner as in Example 2 to form an Au film having a thickness of 10 μm. The alloy plate sample thus obtained was named "Example Sample 9".

(EXAMPLE 10)

A pure Mg plate was immersed in a mixture solution of $Na_2Cr_2O_7$, $CaF_2$, and $MgF_2$ for 60 minutes to form an oxidized film having a thickness of 20 Å on the metal surface.

A melamine resin was coated on the oxidized film at a thickness of 20 μm, and the Mg plate was then allowed to stand in air at a humidity of 30% and at a temperature of 35° C. for 72 hours to completely dry the coated melamine resin.

The surface of the melamine resin was subjected to sputter-cleaning and subsequent ion plating in the same manner as in Example 1 to form an Au film. The Mg plate sample thus surface-treated was named "Example Sample 10".

(COMPARATIVE EXAMPLE 3)

An alloy plate composed of 3 wt % of Al, 1 wt % of Zn, and the balance of Mg was immersed in an aqueous solution of 120 g of $Na_2Cr_2O_7$ and 1.2 g of $CaF_2$ dissolved in 1 l of water for 60 minutes to effect a so-called chemical conversion treatment. Thus, an oxidized film having a thickness of 20 Å was formed on the alloy surface.

Subsequently, an Au film having a thickness of 5 μm was deposited on the oxidized film by ion plating in the same manner as in Example 1.

The alloy plate sample thus surface-treated was named "Comparative Example Sample 3".

(COMPARATIVE EXAMPLE 4)

A melamine resin was coated on an alloy plate composed of 3 wt % of Al, 1 wt % of Zn, and the balance of Mg at a thickness of 40 μm, and the alloy plate was then allowed to stand in air at a humidity of 30% and at a temperature of 35° C. for 72 hours to completely dry the coated melamine resin.

Subsequently, the surface of the melamine resin was subjected to sputter-cleaning and subsequent ion plating in the same manner as in Example 1 to deposit an Au film having a thickness of 1.5 μm.

The alloy plate sample thus surface-treated was named "Comparative Example Sample 4".

Example Samples 6 to 10 and Comparative Example Samples 3 to 4 as mentioned above were subjected to the same salt spray test, contact resistance measurement, and heat shock test as in the case of Example Samples 1 to 5 and Comparative Example Samples 1 and 2. The results are shown in Table 2.

TABLE 2

| Sample No. | Performance Test | | |
|---|---|---|---|
| | Salt Spary Test | Contact Resistance | Heat Shock Test |
| Example Sample 6 | Corrosion did not occur even after 1,000 hours' spray. | 1.2 mΩ | Neither peeling nor cracking occurred even after 10,000 times of the heat cycle. |
| Example Sample 7 | Corrosion did not occur even after 1,000 hours' spray. | 1.2 mΩ | Neither peeling nor cracking occurred even after 10,000 times of the heat cycle. |
| Example Sample 8 | Corrosion did not occur even after 1,000 hours' spray. | 1.2 mΩ | Neither peeling nor cracking occurred even after 10,000 times of the heat cycle. |
| Example Sample 9 | Corrosion did not occur even after 1,000 hours' spray. | 1.2 mΩ | Neither peeling nor cracking occurred even after 10,000 times of the heat cycle. |
| Example Sample 10 | Corrosion did not occur even after 1,000 hours' spray. | 1.2 mΩ | Neither peeling nor cracking occurred even after 10,000 times of the heat cycle. |
| Comparative Example Sample 3 | Corrosion occurred in 1 hours' spray. | 1.2 mΩ | Degeneration such as peeling and/or cracking occurred in 7 times of the heat cycle. |
| Comparative Example Sample 4 | Corrosion occurred in 2 hours' spray. | 1.2 mΩ | Degeneration such as peeling and/or cracking occurred in 11 times of the heat cycle. |

From the results shown in Table 2 which demonstrates that every one of Example Samples 6 to 10 according to the present invention did not give rise to corrosion of the Mg or Mg alloy even after 1,000 hours in the salt spray test, it will be understood that the surface treatment process of the present invention provides excellent corrosion resistance to Mg or an Mg alloy. On the other hand, it will be understood that formation of either an oxidized film or a thermosetting resin film alone on the surface of an Mg or Mg alloy plate sample and subsequent deposition of an Au film thereon provide poor corrosion resistance, as can be seen in the progress of corrosion only after 1 to 2 hours in the salt spray test under the same conditions as in the case of the Example samples.

Since in the Example Samples 6 to 10 each comprised the organic coating film between the oxidized film and the Au film, neither peeling nor cracking of the film occurred even after 10,000 times of the cycle of keeping a sample at −190° C. for 30 minutes and at +100° C. for 30 minutes in the heat shock test, thus demonstrating excellent heat shock resistances of the Example Samples. By contrast, in the case of the Comparative Example Samples, degeneration such as peeling and/or cracking of the film appeared after only 7 to 11 times of the heat cycle. Even in the case of the Comparative Example Sample 4 comprising the Au film provided via the melamine resin film on the alloy plate sample without provision of a chemical conversion treated oxidized film on the plate, the heat shock resistance of the sample was low because of poor adhesion of the melamine resin film to the alloy plate sample.

An Mg alloy subjected to an oxidation treatment and having multiple layers of thermosetting resin films and a single layer of a conductive film provided thereon, and an Mg alloy having a single layer of a thermosetting resin film and multiple layers of conductive films provided on an oxidized film were prepared according to the following procedures.

(EXAMPLE 11)

An electrode lead wire was connected with an alloy plate composed of 3 wt % of Al, 1 wt % of Zn, and the balance of Mg. Thereafter, the alloy plate was immersed in an aqueous mixture solution of 165 g of KOH, 35 g of KF, 35 g of $Na_3PO_4$, 35 g of $Al(OH)_3$, and 20 g of $KMnO_4$ dissolved in 1 l of water, and anodized at a voltage of AC 40 V and at a current density of 2.0 $A/dm^2$ for 15 minutes to form an oxidized film having a thickness of 20 μm on the surface of the alloy plate. Subsequently, an epoxy resin was coated on the oxidized film at a thickness of 10 μm, and a urethane resin was further coated thereon at a thickness of 15 μm. After solidification of the thermosetting resins, the surface of the thermosetting resin film was cleansed and simulaneously activated by sputter-cleaning under conditions of $5 \times 10^{-5}$ Torr in Ar gas pressure and $-20$ V in bias voltage. Subsequently, ion plating was conducted under conditions of $2 \times 10^{-4}$ Torr in Ar gas pressure and $-200$ V in bias voltage to deposit 5 μm of Au on the resin surface. The alloy plate thus surface-treated was named "Example Sample 11".

(EXAMPLE 12)

The surface of an alloy composed of 3 wt % of Al, 1 wt % of Zn, and the balance of Mg was anodized under the same conditions as in Example 11 to form an oxidized film having a thickness of 20 μm. Subsequently, an epoxy resin was coated on the oxidized film at a thickness of 10 μm. After solidification of the thermosetting resin, the surface of the thermosetting resin was cleansed and simultaneously activated by sputter-cleaning in the same manner as in Example 11. Subsequently, ion plating was conducted under conditions of $2 \times 10^{-4}$ Torr in Ar gas pressure and $-200$ V in bias voltage to deposit 0.04 μm of Ni on the resin surface and, sequentially, 5 μm of Au thereon. The alloy plate thus surface-treated was named "Example Sample 12".

Five kinds of Mg or Mg alloy comprising an oxidized film formed on the surface thereof, multiple layers of thermosetting resin films formed thereon, and multiple layers of conductive films sequentially formed thereon, and three kinds of Mg or Mg alloy not having one of an oxidized film, a thermosetting resin film, and a conductive film were prepared according to the following procedures.

(EXAMPLE 13)

A pure Mg plate was immersed in an aqueous mixture solution of 120 g of $Na_2Cr_2O_7$, 12 g of $CaF_2$, and 12 g of $MgF_2$ dissolved in 1 l of water for 60 minutes to effect a chemical conversion treatment. Thus, an oxidized film having a thickness of 20 Å was formed.

An epoxy resin was coated on the oxidized film at a thickness of 5 μm, and a urea resin was further coated thereon at a thickness of 2.5 μm. After solidification of the thermosetting resins, ion plating was conducted under conditions of $4 \times 10^{-4}$ Torr in Ar gas pressure and $-70$ V in bias voltage to deposit 0.05 μm of Ti on the resin surface and, sequentially, 3 μm of Au. The alloy plate thus surface-treated was named "Example Sample 13".

(EXAMPLE 14)

Figure 2:
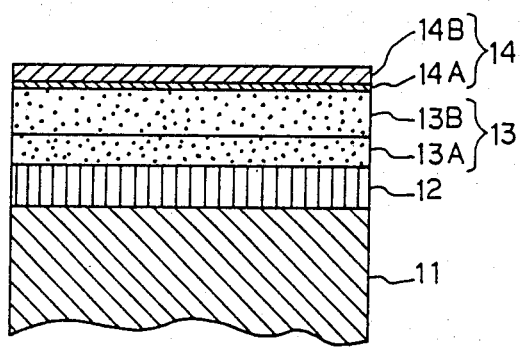

This Example will be described with reference to FIG. 2. In the Figure, the numeral 11 indicates an Mg alloy plate, the numeral 12 an anodized film, and the numeral 13 a thermosetting film consisting of two layers 13A and 13B. The numeral 14 indicates a conductive film consisting of two layers 14A and 14B.

The surface of an alloy plate 11 composed of 3 wt % of Al, 1 wt % of Zn, and the balance of Mg was anodized under the same conditions as in Example 11 to form an oxidized film having a thickness of 20 μm. Subsequently, an epoxy resin 13A was coated on the oxidized film 12 at a thickness of 10 μm, and a urethane resin 13B was then coated thereon at a thickness of 15 μm to form a thermosetting resin layer 13. After solidification of the thermosetting resin layer 13, the surface of the urethane resin 13B was subjected to sputter-cleaning. Thereafter, ion plating was conducted under conditions of $2 \times 10^{-4}$ Torr in Ar gas pressure and $-260$ V in bias voltage to deposit 0.04 μm of Ni 14A. Ion plating was further conducted under the same conditions as in Example 1 to deposit 5 μm of Au 14B. Thus, a conductive film 14 was formed. The alloy plate thus obtained was named "Example Sample 14".

(EXAMPLE 15)

An alloy plate composed of 6 wt % of Zn, 0.5 wt % of Zr, and the balance of Mg was immersed in an aqueous mixture solution of 120 g of $Na_2Cr_2O_7$, 12 g of $CaF_2$, and 12 g of $MgF_2$ dissolved in 1 l of water for 70 minutes to effect a chemical conversion treatment. Thus, an oxidized film having a thickness of 20 Å was formed.

A phenolic resin was coated on the oxidized film at a thickness of 7 μm, and an acrylic resin was then coated thereon at a thickness of 20 μm. After solidification of the thermosetting resins, the surface of the acrylic resin was subjected to sputter-cleaning and subsequent sputtering under conditions of $3 \times 10^{-3}$ Torr in Ar gas pressure and $-300$ V in bias voltage to deposit 0.1 μm of Al on the resin surface. Ag was further deposited thereon at a thickness of 5 μm by sputtering under conditions of $5 \times 10^{-3}$ Torr in Ar gas pressure and $-250$ V in bias voltage. The alloy plate thus surface-treated was named "Example Sample 15".

(EXAMPLE 16)

An electrode lead wire was connected with a pure Mg plate. Thereafter, the Mg plate was immersed in an aqueous mixture solution of 165 g of KOH, 35 g of KF, 35 g of $Na_3PO_4$, 35 g of $Al(OH)_3$, and 20 g of $KMnO_4$ dissolved in 1 l of water, and anodized under conditions of AC 80 V in voltage and 2.0 $A/dm^2$ in current density for 70 minutes to form an oxidized film having a thickness of 30 μm.

A melamine resin was then coated on the oxidized film at a thickness of 10 μm, and a silicone resin was further coated thereon at a thickness of 20 μm. After solidification of the thermosetting resins, the surface of the silicone resin was subjected to sputter-cleaning and subsequent vacuum deposition under a vacuum of $10^{-5}$ Torr to deposit 0.1 μm of Ti on the thermosetting resin film. Al was further deposited thereon at a thickness of 3 μm in the same manner as mentioned above. The Mg plate thus surface-treated was named "Example Sample 16".

(EXAMPLE 17)

An alloy plate composed of 3 wt % of Al, 1 wt % of Zn, and the balance of Mg was immersed in an aqueous mixture solution of 120 g of $Na_2Cr_2O_7$, 12 g of $CaF_2$, and 12 g of MgF dissolved in 1 l of water for 60 minutes to effect a chemical conversion treatment. Thus, an oxidized film having a thickness of 30 Å was formed.

An epoxy resin was coated on the oxidized film at a thickness of 5 μm, and a urea resin was then coated thereon at a thickness of 25 μm. After solidification of the thermosetting resins, the surface of the urea resin was subjected to sputter-cleaning. Subsequently, ion plating was conducted under conditions of $4 \times 10^{-4}$ Torr in Ar gas pressure and −70 V in bias voltage to deposit 0.05 μm of Ti and, sequentially, 3 μm of Au. The alloy plate thus surface-treated was named "Example Sample 17".

(COMPARATIVE EXAMPLE 5)

A pure Mg plate was anodized under the same conditions as in Example 11 to form an oxidized film having a thickness of 20 μm on the surface thereof. Subsequently, ion plating was conducted under the same conditions as in Example 11 to deposit 0.04 μm of Ni and 5 μm of Au on the oxidized film. The Mg plate thus surface-treated was named "Comparative Example Sample 5".

(COMPARATIVE EXAMPLE 6)

Without an oxidized film, a phenolic resin and an acrylic resin were directly coated on an alloy plate composed of 6 wt % of Zn, 0.5 wt % of Zr, and the balance of Mg at thicknesses of 7 μm and 20 μm, respectively. After solidification of the thermosetting resin film, the surface of the resin film was subjected to sputter-cleaning. Al and Ag were deposited on the thermosetting resin film at thicknesses of 0.1 μm and 5 μm, respectively, under the same sputtering conditions as in Example 15. The alloy plate thus surface-treated was named "Comparative Example sample 6".

(COMPARATIVE EXAMPLE 7)

An alloy plate composed of 3 wt % of Al, 1 wt % of Zn, and the balance of Mg was anodized under the same conditions as in Example 11 to form an oxidized film having a thickness of 20 μm. An epoxy resin was coated on the oxidized film at a thickness of 10 μm, and a urethane resin was then coated thereon at a thickness of 15 μm. The alloy plate thus surface-treated was named "Comparative Example Sample 7".

The results of a salt spray test, a contact resistance test, and a heat shock test carried out with respect to Example Samples 11 to 17 and Comparative Example Samples 5 to 7 are shown in Table 3. The conditions of the tests were the same as in Examples 1 to 5.

TABLE 3

| Sample No. | Performance Test | | |
|---|---|---|---|
| | Salt Spary Test | Contact Resistance | Heat Shock Test |
| Example Sample 11 | Corrosion did not occur even after 1,000 hours' spray. | 1.2 mΩ | Neither peeling nor cracking occurred even after 10,000 times of the heat cycle. |
| Example Sample 12 | Corrosion did not occur even after 1,000 hours' spray. | 1.2 mΩ | Neither peeling nor cracking occurred even after 10,000 times of the heat cycle. |
| Example Sample 13 | Corrosion did not occur even after 1,000 hours' spray. | 1.2 mΩ | Neither peeling nor cracking occurred even after 10,000 times of the heat cycle. |
| Example Sample 14 | Corrosion did not occur even after 1,000 hours' spray. | 1.2 mΩ | Neither peeling nor cracking occurred even after 10,000 times of the heat cycle. |
| Example Sample 15 | Corrosion did not occur even after 1,000 hours' spray. | 0.9 mΩ | Neither peeling nor cracking occurred even after 10,000 times of the heat cycle. |
| Example Sample 16 | Corrosion did not occur even after 1,000 hours' spray. | 7.0 mΩ | Neither peeling nor cracking occurred even after 10,000 times of the heat cycle. |
| Example Sample 17 | Corrosion did not occur even after 1,000 hours' spray. | 1.2 mΩ | Neither peeling nor cracking occurred even after 10,000 times of the heat cycle. |
| Comparative Example Sample 5 | Corrosion occurred in 2 hours' spray. | 1.2 mΩ | Peeling and cracking occurred in 7 times of the heat cycle. |
| Comparative Example Sample 6 | Corrosion occurred in 1 hours' spray. | 0.9 mΩ | Peeling and cracking occurred in 5 times of the heat cycle. |
| Comparative Example Sample 7 | Corrosion did not occur even after 1,000 hours' spray. | more than 1,000Ω | Neither peeling nor cracking occurred even after 10,000 times of the heat cycle. |

From the results shown in Table 3, the Example Samples 11 to 17 having an oxidized film formed on Mg or an Mg alloy, a single or multiple layer(s) of thermosetting resin film formed thereon, and a single or multiple layer(s) of conductive film formed thereon according to the present invention shows excellent corrosion resistances, surface conductivities, and heat shock resistances. By contrast, the Comparative Example Sample 5 having an oxidized film and multiple layers of conductive film but no thermosetting resin film gives early rise to corrosion of Mg and is weak in heat shocks because it has no resin film serving for buffering a difference in thermal expansion between the oxidized film and the conductive film. The Comparative Example Sample 6 having the multiple layers of thermosetting resin and the multiple layers of conductive film directly formed on the surface of the Mg alloy without formation of an oxidized film thereon tends to give rise to corrosion of the Mg alloy, and is poor in heat shock resistance because of poor adhesion of the thermosetting resin to the Mg alloy. The Comparative Example Sample 7 are excellent in corrosion resistance and heat shock resistance due to the oxidized film formed on the surface of the Mg alloy and the multiple layers of thermosetting resin film formed thereon, but poor in surface conductivity because of lack of a conductive film provided.

The Mg or Mg alloy samples having the oxidized film formed on the surface thereof, the single or multiple layers of thermosetting resin film, and the single or multiple layers of conductive film as described above were examined with respect to adhesion of the film. The test method is called a peeling test. Ten lines were cut on the surface of the surface-treated an Mg or Mg alloy sample with a sharp cutter at intervals of 1 mm, and ten lines were further cut thereon perpendicularly to the above-mentioned ten lines with the sharp cutter at intervals of 1 mm to form a total of 100 squares having a length of every side of 1 mm. After a pressure-sensitive adhesive tape was strongly pressed against the cut surface of the alloy sample, the pressure-sensitive adhesive tape was peeled by pulling the same in the vertical direction to the surface of the sample. The adhesion of the film was evaluated in terms of the number of squares of the film peeled from the Mg or Mg alloy, while adhering to the pressure-sensitive adhesive tape, of the 100 squares. The test results of the Examples Samples 1, 2, 11, 12 and 14 and Comparative Example Samples 5 and 6 as representative examples are shown in Table 4.

TABLE 4

| Comparative | Oxidation Treatment | Thermoset Resin Film | Conductive Film | Peeling Test Result |
|---|---|---|---|---|
| Example Sample 1 | Anodizing treatment | melamine resin | Au | 73/100 |
| Example Sample 2 | Anodizing treatment | epoxy resin | Au | 91/100 |
| Example Sample 11 | Anodizing treatment | epoxy resin + urethane resin | Au | 26/100 |
| Example Sample 12 | Anodizing treatment | epoxy resin | Ni + Au | 3/100 |
| Example Sample 14 | Anodizing treatment | epoxy resin + urethane resin | Ni + Au | 0/100 |
| Comparative Example Sample 5 | Anodizing treatment | not coated | Ni + Au | 87/100 |
| Comparative Example Sample 6 | not made | phenolic resin + acrylic resin | Al + Ag | 100/100 |

In the Example sample 14 having two layers of the thermosetting resin films provided on the surface of the Mg alloy subjected to the anodizing treatment and the two layers of the conductive films of Ni and Au provided thereon, no peeling occurred at all. This is because the adhesion of the epoxy resin to the oxidized film and the adhesion of the urethane resin to Ni are both strong. Formation of a layer of an active metal such as Ni, Al, Ti or Cr as the base layer provides a strong adhesion between the thermosetting resin film and the conductive film, as in the cases of Ni or Ti as the base of highly conductive Au, Al as the base of Ag as in Example 15, and Ti as the base of Al as in Example 16. Further, sputter-cleaning of the surface of resin is effective for enhancing the adhesion, as demonstrated by a difference in the peeling test results between the Example Sample 1 and the Example Sample 2. The Example Sample 12 having the single layer of the thermosetting resin film shows a high adhesion next to that of the Example Sample 14. In the Comparative Example Sample 5 having no thermosetting resin film even with Ni as the base layer, the conductive film was substantially completely peeled because of a weak adhesion of the conductive film to the oxidized film. In the comparative Example Sample 6 having the Al film as the base layer, since the surface of the Mg alloy was not subjected to any oxidization treatment, the adhesion of the thermosetting resin to the Mg alloy was so weak that the resin film was completely peeled. The Example Sample 11 having tte multiple layers of the resin films provided on the Mg alloy subjected to the anodizing treatment and the single layer of the conductive Au film provided thereon showed an excellent adhesion next to that of the Example Sampe 12.

As described above, since the surface-treated Mg or Mg alloy according to the present invention comprises an oxidized film, a single or multiple kind(s) of thermosetting resin film(s), and a single or multiple kind(s) of conductive film(s) sequentially formed on the Mg or Mg alloy, it is not only excellent is surface conductivity due to the presence of the conductive film but also remarkably improved in corrosion resistance and abrasion resistance due to the presence of the thermosetting resin film underneath the conductive film and the presence of the hard oxidized film thereunderneath. Even if part of the conductive film and the thermosetting resin film is damage, the Mg or Mg alloy was protected by the oxidized film. The presence of the thermosetting resin film contributes to not only improvements of the corrosion resistance and the abrasion resistance but also an improvement of the heat shock resistance due to elasticity peculiar to the polymer material, since the thermosetting resin film present between the lowermost layer of the oxidized film and the uppermost layer of the conductive film plays a role of buffering a difference in thermal expansion between the oxidized film and the conductive film. Furthermore, the presence of the thermosetting resin film exerts an effect of enhancing the originally excellent vibration absorbing capacity of the Mg or Mg alloy as a merit thereof. Where a casing of an Mg alloy mounted on a artificial satellite includes electronic circuits, etc. therein, the electronic circuits inside the casing are surely protected from vigorous vibration at the time of launching the artificial satellite. Thus, the reliability of machines and instruments mounted on the artificial satellite is remarkably improved.

The thermosetting resin which has intruded into the recessed portions and pinholes of the oxidized film exerts an effect of enhancing the adhesion of the thermosetting resin to the oxidized film. When a conductive film of gold, silver, copper, aluminum, nickel, or the like is deposited on an organic thin film by ion plating, sputtering, or the like, the adhesion of the thermosetting resin film to the surface conductive film can be enhanced by suppressing the temperature of the thermosetting resin at the time of ion plating, sputtering, or the like not to exceed the thermal decomposition temperature of the thermosetting resin. Where the adhesion of the surface film must be further enhanced, a thermosetting resin having a high affinity for the oxidized film is formed on the oxidized film, and a thermosetting resin having a high affinity for the surface conductive film is formed on the former thermosetting resin, whereby the purpose is attained.

The anodizing method used for formation of the oxidized film is capable of easily controlling the film thickness by controlling the current density, the time of electricity supply, etc. An aqueous mixture solution of NaOH, $(HO.CH_2.CH)_2O$, and $Na_2C_2O_2$, or other solution may be employed as the electrolyte solution, too. The oxidized film formed by a chemical conversion treatment is so dense that high corrosion resistance and abrasion resistance can be secured even if the film is thin. An aqueous mixture solution of NaOH, $(HO.CH_2.CH)_2O$, and $Na_2C_2O_4$, or other solution may be employed as the chemical conversion treatment solution, too. The chemical conversion treatment is capable of controlling the film thickness by varying the composition of the solution and the treatment temperature.

As the material of the thermosetting resin film formed on the oxidized film, there can be mentioned a melamine resin, an epoxy resin, a phenolic resin, a urea resin, a xylene resin, a silicone resin, a polyimide resin, an acrylic resin, a polyurethane resin, a methacrylic resin, a polyvinyl formal resin, one kind, or two or more kinds of which may be employed in the film.

As the metal for forming the conductive layer, there can be mentioned Au, Ag, Cu, Al, Ni, Sn, other materials and alloys. Formation of the metallic layer can be done according to electroless plating or other method, too.

INDUSTRIAL APPLICABILITY

As described above, the surface-treated Mg or Mg alloy according to the present invention not only can provide a notable improvement of corrosion resistance, the insufficiency of which is a defect of Mg as well as an Mg alloy, but also has a high surface conductivity, and can provide improved heat shock resistance and abrasion resistance. Thus, this invention is capable of wide spread of Mg or an Mg alloy in the fields of aeropace machines and instruments, electric precision machines and instruments, and automobile parts.

What is claimed is:

1. A surface-treated magnesium or magnesium alloy comprising:
   an oxidized film formed on the surface of magnesium or a magnesium alloy;
   a first thermosetting resin film, which is composed of a material selected from the group consisting of epoxy resin, phenolic resin and melamine resin, formed on said oxidized film;
   a second thermosetting resin film, which is composed of a material selected from the group consisting of urea resin, urethane resin and silicone resin, formed on said first resin film;
   a first metal film, which is composed of a metal selected from the group consisting of titanium, nickel and chromium, ion-plated on said second thermosetting resin film; and
   a second metal film, which is composed of a metal selected from the group consisting of gold, silver and aluminum, formed on said first metal film.

2. A surface-treated magnesium or magnesium alloy as claimed in claim 1, wherein said oxidized film is a chemically treated film.

3. A surface-treated magnesium or magnesium alloy as claimed in claim 1, wherein said oxidized film is an anodized film.

4. A process for treating a surface of magnesium or magnesium alloy comprising the steps of:
   forming an anodized film on the surface of magnesium or magnesium alloy;
   forming a first thermosetting resin film consisting of a material selected from the group consisting of epoxy resin, phenolic resin and melamine resin on said anodized film;
   forming a second thermosetting resin film consisting of a material selected from the group consisting of urea resin, urethane resin and silicone resin on said first thermosetting resin;
   ion-plating a metal film consisting of a metal selected from the group consisting of titanium, nickel and chromium on said second thermosetting resin film; and
   forming a metal film consisting of a metal selected from the group consisting of gold, silver and aluminum on said ion-plated metal film.

5. A process for treating a surface of magnesium or magnesium alloy comprising the steps of:
   forming a chemically converted oxidized film on the surface of magnesium or magnesium alloy;
   forming a first thermosetting resin film consisting of a material selected from the group consisting of epoxy resin, phenolic resin and melamine resin on said chemically converted oxidized film;
   forming a second thermosetting resin film consisting of a material selected from the group consisting of urea resin, urethane resin and silicone resin on said first thermosetting resin;
   ion-plating a metal film consisting of a metal selected from the group consisting of titanium, nickel and chromium on said second thermosetting resin film; and
   forming a metal film consisting of a metal selected from the group consisting of gold, silver and aluminum on said ion-plated metal film.

* * * * *